United States Patent [19]

Sato

[11] 4,168,168

[45] Sep. 18, 1979

[54] METHOD OF MAKING DURABLE PHOTOMASKS WITH METAL ION DIFFUSION

[75] Inventor: Masamichi Sato, Asaka, Japan

[73] Assignee: Fuji Photo Film Co., Ltd., Minami-ashigara, Japan

[21] Appl. No.: 930,838

[22] Filed: Aug. 3, 1978

[30] Foreign Application Priority Data

Aug. 3, 1977 [JP] Japan .................. 52-93236

[51] Int. Cl.$^2$ .................. G03C 5/00; G03C 11/00
[52] U.S. Cl. .................. 96/38.3; 96/36; 96/34; 427/165; 428/210
[58] Field of Search .................. 96/36, 38.3, 34; 427/165; 428/210

[56] References Cited

U.S. PATENT DOCUMENTS

| | | | |
|---|---|---|---|
| 3,561,963 | 2/1971 | Kiba | 96/36.2 |
| 3,592,649 | 7/1971 | Parsonage et al. | 96/36 |
| 3,620,795 | 11/1971 | Kiba | 96/38.3 X |
| 3,639,125 | 2/1972 | Chand | 96/35 |
| 3,732,792 | 5/1973 | Tarnopol et al. | 96/38.3 X |
| 3,754,913 | 8/1973 | Takeuchi et al. | 96/38.3 |
| 3,814,605 | 6/1974 | Gallois et al. | 96/58 |
| 3,960,560 | 6/1976 | Sato | 96/36 |
| 3,966,473 | 6/1976 | Sato | 96/36 |
| 4,110,114 | 8/1978 | Sato | 96/36 |
| 4,113,486 | 9/1978 | Sato | 96/36 |

*Primary Examiner*—Edward C. Kimlin
*Attorney, Agent, or Firm*—Sughrue, Rothwell, Mion, Zinn and Macpeak

[57] ABSTRACT

A method of producing a durable photomask comprising,
  forming a silver image pattern in a silver halide emulsion layer on a glass support by imagewise exposing the emulsion layer followed by development,
  removing pattern-like the silver halide emulsion layer utilizing the difference in property between the silver image-containing portions and the non-silver image-containing portions of the emulsion layer to partially uncover the surface of the glass support at the portions where the emulsion layer was removed,
  applying a silver ion-supplying material and/or a copper ion-supplying material on the glass support to form a layer of the ion-supplying material, and
  heating the glass support at a high temperature to diffuse the metal ions into the surface of the glass support at the uncovered surface portions of the glass support.

12 Claims, 8 Drawing Figures

METHOD OF MAKING DURABLE PHOTOMASKS WITH METAL ION DIFFUSION

BACKGROUND OF THE INVENTION

1. Field of the Invention

This invention relates to a method of producing photomasks and, more particularly, it relates to a method of producing photomasks having improved durability.

2. Description of the Prior Art

Hitherto, emulsion masks each having a desired pattern at the emulsion layer coated on a transparent glass substrate have been widely used as photomasks used for making semiconductor devices such as IC's, LSI's, etc., printed circuit plates, shadow masks, etc. Also, in selectively exposing a layer of a photoresist on a substrate to be treated such as a semiconductor wafer using an emulsion mask, a so-called contact exposure method in which, the photoresist layer on the wafer is exposed in a close contact relationship with the emulsion mask having a mask pattern therein is most generally employed.

However, since in the close exposure method using an emulsion mask as described above the emulsion mask having the mask pattern is closely contacted with the photoresist layer, the comparatively soft emulsion mask having the mask pattern therein tends to be damaged. This results in difficulties in using the method described above because the number of times the emulsion mask is usable is decreased, the masks must be changed frequently and large numbers of masks are needed, much time is required for exchanging the masks, and further it becomes difficult to automate the mask alignment.

One method for preventing emulsion masks having mask patterns therein from being damaged is a method in which a layer of a metal or an oxide thereof such as chromium or chromium oxide is used to form a mask pattern in place of the emulsion layer on a glass substrate. However, in this method, the durability is limited since in this method although damage of the mask pattern may be minimized the pattern is formed on a glass support as a convex pattern, and further when, for example, a silicone wafer is contact-printed using a mask having such a convex pattern, the convex structure portion is pressed against the surface of the wafer. Thus, both photoresists and photomasks tend to be damaged and, in particular, such is severe for photomasks. Also, in conventional photomasks where many are consumed, the use of expendable substrates is disadvantageous and hence it is necessary to use inexpensive substrates. Therefore, if the size of the photomask substrate is increased, the flatness of the photomask is reduced, which results in limitations on the formation of fine patterns.

Various attempts have hitherto been made for overcoming these difficulties inherent in conventional photomasks. One of these methods is described in U.S. Pat. No. 3,561,963 and also in U.S. Pat. No. 3,732,792, column 9, lines 17–37. According to these conventional methods, metal ions are diffused imagewise into a glass support to form portions, which obstruct the transmission of ultraviolet light in the support, and the colored portions in the glass support are used as a mask image. Since in this method, a mask image is formed in a glass support and hence the mask image formed is flat without any convex portions being formed, the difficulties described above are all overcome and a photomask having a very excellent durability can be obtained.

The most advantageous method for obtaining such a photomask is disclosed in U.S. Pat. No. 3,561,963. This method is carried out by forming uniformly a photoresist layer on a glass support, imagewise exposing the photoresist layer followed by development to form a relief image and, at the same time, uncover the surface of the glass support at the non-relief image-bearing portions, applying uniformly a metal ion-supplying material over the entire surface of the relief image-bearing glass support, and then heating the glass support to diffuse the metal ions into the surface of the glass support at the uncovered portions, whereby the uncovered portions are selectively colored to provide a mask image.

However, it has now been found in such a method, after applying the ion-supplying material onto the surface of a relief image-bearing glass support, when the glass support was heated with the relief image remaining on the support for coloring the uncovered portions only of the glass support, the surface of the glass support was colored not only at the uncovered portions but also at the relief image-bearing portions, that is, the photoresist layer used in U.S. Pat. No. 3,561,963 described above was not useful as a material for preventing the ions from the ion supplying material from diffusing into other portions of the glass support surface than the uncovered portions.

That is, when, after applying onto a glass support either a negative-type/photoresist, KTFR (tradename, produced by Eastman Kodak Co.) or a positive-type photoresist, AZ-1350 (tradename, produced by Shipley Co.), which are the most popular photoresists used in this field, at a thickness of about 1 to 3 microns, a resist pattern was formed in a conventional manner and then a silver ion-supplying material was applied thereon followed by a heat treatment, the silver ions diffused into the overall surface of the glass support, whereby the resist pattern-bearing portions and the non-resist pattern-bearing portions were almost similarly colored in using AZ-1350, while the coloring of the glass support at the resist pattern-bearing portions was slightly less than that at the non-resist pattern-bearing portions in using KTFR but the contrast between the two portions was very low even in the latter case.

Therefore, in the process described in U.S. Pat. No. 3,561,963, a method is employed in which an ion-supplying material layer such as a deposited layer of copper is uniformly formed on the surface of a glass plate having formed thereon a relief image of a photoresist, then the relief image is removed from the glass support together with the ion-supplying material layer formed on the relief image having the ion-supplying material layer on the non-relief image-bearing portions, i.e., formed directly on the glass surface, and the glass support was heated to imagewise color the surface of the glass support.

However, in such a method, the steps are complicated since additionally, after forming an ion-supplying material layer, the relief image and the ion-supplying material layer formed thereon must be selectively removed leaving the ion-supplying material layer on the non-relief image portions only, and the removal of the relief image must be performed by the action of a strong solvent such as acetone. Hence it is difficult to remove selectively the relief image-bearing portions only and disadvantageously there is the possibility that the ion-supplying material layer at the relief image-bearing portions is partially removed with the removal of the relief image to spoil the mask image formed. Furthermore, the most important fault in this method is because the ion-supplying material must be selectively removed in accordance with the relief image present on the support and hence the material used must be capable of forming a continuous coating such as a deposited layer, which results in limiting usable ion-supplying materials to a very narrow range and also makes it difficult to use ion-supplying materials having a large ion-supplying effect as will be explained below.

SUMMARY OF THE INVENTION

Thus, as the result of various investigations for overcoming all of the difficulties as indicated above, it has now been discovered that the use of a silver halide emulsion layer in place of the photoresist in the above-described technique provides remarkable and unexpected effects. That is, it has been discovered that by applying an ion-supplying material onto the surface of a glass support having a relief image of a silver halide emulsion formed by treating the emulsion layer coated thereon and then heating the support with the relief image remaining thereon, the glass support surface is colored at the non-relief image-bearing portions only and without the relief image-bearing portions being colored, whereby a colored pattern having very sharp and high contrast is obtained.

Moreover, in the conventional process described above, a photoresist is used but since the light-sensitivity of a photoresist is very low, it is impossible to obtain a relief image of the photoresist by imagewise exposure of the photoresist layer using a specific means called a "pattern generator". Therefore, a photosensitive material composed of a glass support having a silver halide emulsion layer is used for the pattern generator. However, since the silver image obtained by exposing the silver halide photosensitive plate using a pattern generator usually has poor durability and chemical resistance, attempts have been made to subject a photosensitive material composed of a glass support having thereon a photosensitive layer as used in the conventional process described above to a so-called contact exposure using the silver image, that is, to expose the photoresist-type photosensitive plate to ultraviolet light in a close contact relationship with the silver image, and then to subject the exposed photoresist-type photosensitive material to the steps of development of the photoresist layer, coating an ion-supplying material, etc., as described above for obtaining a colored mask on the glass support. Thus, for obtaining a photomask using the process, described above two types of photosensitive materials must be used due to the low sensitivity of the photoresist. This results in increasing material costs and many defects occur in the colored masks obtained due to the increased steps. Therefore, since a silver halide emulsion is used in place of a photoresist according to the discovery of this invention, a reduced number of materials is used and the steps are very simple.

An object of this invention is, therefore, to provide a method of producing photomasks having a markedly improved durability comprising substantially flat mask images formed in a glass support.

Another object of this invention is to provide a method of producing the durable photomasks described above using simple image-forming steps.

Still another object of this invention is to provide a method of producing large size durable photomasks at a low cost.

A further object of this invention is to provide a method of producing durable photomasks using highly-sensitive photo-sensitive materials.

The above-described objects of this invention are attained by the method of producing durable photomasks of this invention which comprises imagewise exposing a photosensitive material comprising a glass support having, directly or through a subbing layer, a silver halide emulsion layer thereon followed by development, removing the silver halide emulsion layer at one of the image-exposed portions or the non-image exposed portions to uncover the glass support surface at the portions removed leaving the other portions on the glass support, applying a silver ion-supplying material or a copper ion-supplying material to at least the uncovered surface portions of the glass support with silver or copper ions from the ion-supplying material being capable of being diffused into the glass support by heating to color the portions of the glass support where diffusion occurs, heating the glass plate with the layer of the ion-supplying material thereon to a temperature above at least about 375° C. to selectively diffuse at least the silver ions or copper ions into the uncovered surface of the glass support, and then removing the silver halide emulsion layer and the silver ion and/or copper ion supplying material remaining on the glass support.

DETAILED DESCRIPTION OF THE INVENTION

The method of this invention is explained in more detail by reference to the accompanying drawings.

Figure 1:
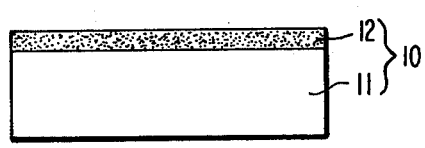
FIG. 1 to FIG. 6 are schematic cross-sectional views showing an embodiment of the method of this invention.
Figure 2:
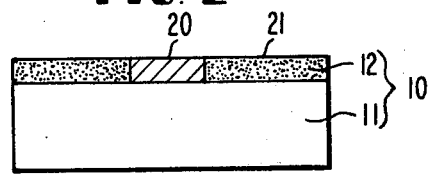
Figure 3:
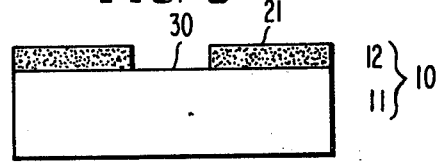
Figure 4:
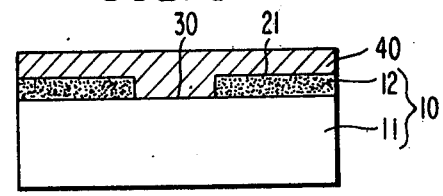

FIG. 1 shows an emulsion plate 10 having a silver halide emulsion layer 12 on a colorless transparent glass support 11. By imagewise exposing the emulsion layer 12 followed by development, a silver image 20 is formed at the exposed portions as shown in FIG. 2, while the silver halide emulsion layer remains at the non-exposed portions 21. Then, the plate is treated with an etch-bleach solution, whereby the silver image portions 20 are removed to uncover the surface of the support at the portions as shown in FIG. 3. In this step, the silver halide emulsion layer remains substantially unchanged at the non-exposed portions. Then, as shown in FIG. 4, a silver ion-supplying material and/or a copper ion-supplying material 40 is applied onto the entire surface of the plate. When the glass support is heated to a high temperature (e.g., about 400° to 450° C.), the silver ions and/or copper ions diffuse into the glass support at the uncovered portions 30 to color the portions as shown by 50 in FIG. 5 but the areas of the glass support at the emulsion relief-bearing portions are not colored. Finally, by removing the remaining silver ion-supplying material and/or copper ion-supplying material and the silver halide emulsion layer from the plate, a durable photomask composed of colored portions 50 and uncolored portions 60 is obtained as shown in FIG. 6.

Figure 6:
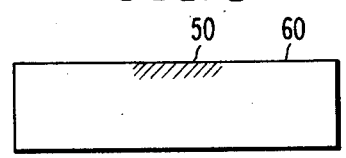
Figure 7:
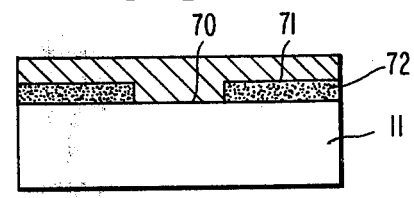
FIG. 7 and FIG. 8 are schematic cross-sectional views showing an embodiment of comparison methods.
Figure 8:

FIG. 7 and FIG. 8 show an embodiment where a photoresist is used for the sake of comparison. FIG. 7 shows the state where a glass support 11 has a photoresist pattern 71 formed thereon and a silver ion-supplying material and/or copper ion-supplying material 72 directly on the surface thereof at the uncovered portions 70. FIG. 8 shows the state where after heat-treating the glass support at a high temperature, the remaining ion-supplying material and photoresist have been removed therefrom, in which the surface of the glass support is composed of portions 80 where no resist was present and portions 81 where the resist was present. In this case, portions 81 where the resist was present are colored to a considerable extent and hence the contrast of the final pattern is low. For example, the optical density difference between the resist-bearing portions and the non-resist-bearing portions of the colored layer at a wavelength of 400 nm is about 0.6. On the other hand, the optical density difference of the pattern produced according to this invention as shown in FIG. 6 is higher than 3.0.

Examples of glasses which can be used in this invention as the glass support are alkali silicate glass, soda lime glass, potassium lime glass, lead glass, borosilicate glass, and other sodium or potassium-containing glasses. In this invention, the glass must contain sodium or potassium because in diffusing the silver ions and/or copper ions into the surface of glass in the subsequent step, an ion-exchange between the silver ions and/or the copper ions and the sodium ions or potassium ions is performed.

The silver halide emulsion which is coated on the glass support in this invention can be prepared by dispersing silver halide in an aqueous hydrophilic binder colloid dispersion. Examples of suitable silver halides are silver chloride, silver bromide, silver iodide, silver chlorobromide, silver iodobromide, silver chloroiodide, silver chloroiodobromide, etc. The most typical example of a silver halide emulsion which can be used in this invention contains more than about 90 mole percent silver bromide (preferably simultaneously containing less than about 5 mole percent silver iodide), has a mean silver halide grain size of less than about 0.1 $\mu$m (a so-called Lipmann emulsion), and has a silver halide to aqueous hydrophilic binder weight ratio of from about 1:4 to about 8:1. In another example, a preferred silver halide emulsion which can be used in this invention, contains more than about 90 mole percent silver bromide (preferably simultaneously containing less than about 5 mole percent silver iodide), has a mean silver halide grain size of less than about 1 $\mu$m, and has a silver halide to aqueous hydrophilic binder weight ratio of from about 1:4 to about 6:1. In still another example of a silver halide emulsion which can be used in this invention, the emulsion contains more than about 50 mole percent silver chloride (preferably containing more than 70 mole percent silver chloride), has a mean silver halide grain size of less than about 1 $\mu$m, and has a silver halide to aqueous hydrophilic binder weight ratio of from about 1:4 to about 6:1.

Examples of suitable aqueous hydrophilic binders are gelatin, albumin, casein, cellulose derivatives, agar agar, sodium alginate, saccharide derivatives, polyvinyl alcohol, polyvinyl pyrrolidone, polyacrylamide, etc. If desired, a mixture of two or more binders compatible with each other can be used.

The dry thickness of the silver halide emulsion layer preferably is from about 0.3 to about 10 $\mu$m.

Furthermore, a subbing layer well known in the photographic field may be used between the glass support and the silver halide emulsion layer. Such a subbing layer is a layer of a hydrophilic material showing a strong adhesion to both the support and the silver halide emulsion layer. Examples of materials which can be used for the subbing layer are gelatin, albumin, casein, cellulose derivatives, starch derivatives, sodium alginate, polyvinyl alcohol, polyvinyl pyrrolidone, polyacrylic acid copolymers, polyacrylamide, etc., although other subbing layers may be used if desired. The thickness of the subbing layer preferably is as thin as possible. A suitable thickness is usually about 0.01 to about 1 $\mu$m, preferably 0.05 to 0.5 $\mu$m. However, since the subbing layer is used to improve the adhesion to the glass surface and the silver halide emulsion layer, a subbing layer is used only if necessary and such is not always necessary.

The photosensitive material thus prepared is imagewise exposed and developed as shown in FIG. 2. Photographic processings including conventional exposure, development, fixing, etc., which can be used in this invention are described in "Techniques of Microphotography" *Kodak Data Book*, P. 52 Eastman Kodak Co., Rochester, N.Y., (1970). Suitable developing agents which can be used for forming silver images are those well known in the photographic field, such as, for example, hydroquinone, pyrogallol, 1-phenyl-3-pyrazolidine, p-aminophenol, ascorbic acid, etc.

The developer used in this invention may further contain, if desired, an alkali (e.g., sodium hydroxide, sodium carbonate, etc.), a pH controlling agent or a buffer (e.g., acetic acid, boric acid, etc.), an antifogging agent (e.g., potassium bromide), a preservative (e.g., sodium sulfite), and the like.

In one embodiment of this invention, the silver halide at the unexposed portions is removed by fixing and suitable fixing agents for silver halide, which can be used are silver halide solvents such as, for example, sodium thiosulfate, sodium thiocyanate, etc. The solution containing a fixing agent may contain, if desired, preservatives (e.g., sodium sulfite), a pH buffer (e.g., boric acid), a pH adjusting agent (e.g., acetic acid), a chelating agent, etc.

As a result of the above, a relief image is formed from the silver halide emulsion layer as shown in FIG. 3 and, as an embodiment of relief image forming methods which can be used in this invention, an etch-bleaching is explained in detail below.

In etch-bleaching when a silver halide emulsion layer having a silver image therein is processed using an etch-bleaching solution, the silver image portion of the emulsion layer is dissolved away. Suitable etch-bleaching solutions, which can be used are described in, for example, *TAGA Proceedings*; 1–11 (1967) and *PAS Technical Quarterly*, 130–134 (1955). Specific examples of etch-bleaching solutions are an aqueous solution containing cupric chloride, citric acid, and hydrogen peroxide, an aqueous solution containing copper nitrate, potassium bromide, lactic acid, and hydrogen peroxide, an aqueous solution containing ferric nitrate, potassium bromide, and lactic acid, and an aqueous solution containing stannic chloride and potassium bromide. The etch-bleaching can be conducted at about 15° to about 60° C., preferably 20° to 50° C., for about 20 seconds to about 10 minutes, preferably for 30 seconds to 5 minutes.

Thus, a relief pattern is imagewise formed on the glass support and then a silver ion and/or copper ion-supplying material (hereinafter the silver ion and/or copper ion-supplying material will be collectively described as an ion-supplying material) as shown in FIG. 4 is then applied onto the glass support surface having the relief image thereon.

Such an ion-supplying material diffuses into the glass support by heating to color the glass support and typically materials capable of supplying silver ions and/or copper ions can be used. More preferably, a mixture of silver sulfide and copper sulfide is used. A uniform dispersion of the mixture in a suitable liquid medium such as water, an organic solvent, e.g., turpentine oil, oleic acid, isobutyl alcohol, ethyl alcohol, etc., or water or an organic solvent containing a resin is coated on the glass support using known techniques such as spray coating, brush coating, screen coating, roll coating, etc. to apply a mixture of silver sulfide and copper sulfide to a glass support as a silver ion and copper ion-supplying material. However, in the invention, it is not always necessary to use the ion-supplying material as a dispersion in a liquid but any coating manner may be employed in this invention under the condition that at least silver ions or copper ions can diffuse into the glass by heating from such a coated layer and further the silver ion and/or copper ion-supplying material may be applied to at least the uncovered surface of the glass support at the non-relief image portions.

Moreover, other materials from which silver ions and/or copper ions can diffuse into the glass support under heating may be used in this invention and examples of these other materials are silver nitrate, silver chromate, silver chloride, silver sulfate, $AgI_4WO_4$, copper nitrate, copper chloride, copper sulfate, etc.

Figure 5:
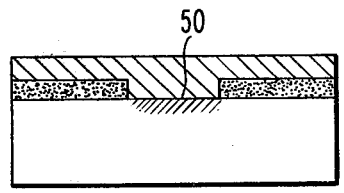

Then, after forming the coated layer of the ion-supplying material on the glass support using the dispersion of the material in a liquid, the coated layer is completely dried and then heated to a high temperature, as shown in FIG. 5.

There are no particular limitations on the atmosphere used in the heat treatment and the heat treatment may be carried out in the air. The heating temperature depends upon the kind of glass and the kind of the silver ion and/or copper ion supplying material employed: Generally a suitable heating temperature is about 375° C. or higher, preferably higher than about 400° C. More specifically for soda lime glass the heating temperature preferably ranges from about 375° to about 450° C. and for potassium lime glass ranges from about 400° to about 500° C. Also, the heating time depends upon the heating temperature but a time of about 20 to about 100 minutes is generally suitable, although other heating times than this specific range may be employed.

As a result of the heat treatment, the silver and/or copper ions in the silver and/or copper ion-supplying material on the non-relief image-bearing portions diffuse into the glass support while the sodium ions or the potassium ions in the glass diffuse into the silver and/or copper ion-supplying material, whereby an ion exchange is performed in an imagewise manner. The silver and/or copper ions diffused into the glass are reduced by impurities in the glass to form electrically neutral atoms and these atoms aggregate to color the surface of the glass support. On the other hand, the diffusion of the silver ions and/or copper ions generated from the ion-supplying material on the relief image-bearing portions into the glass support is prevented by the relief image formed from the silver halide emulsion layer, whereby the glass support is not colored at these portions. This action is most important in this invention, since in this invention, by utilizing this property of the silver halide emulsion layer, the glass support surface is colored only at the non-relief image-bearing portions without coloring the glass surface at the relief image-bearing portions to form a mask image having a high contrast in the glass support.

Since the aggregates of silver colloid and/or copper colloid formed imagewise are colored so that they show large absorption at the wavelength region of about 300 to 500 nm, when a pattern is formed by such a colloid layer, a photomask for a photoresist is obtained. In this case, in order to obtain an image having sufficient image density and high resolving power, the colloid particles must be present near the surface layer of the glass support surface with a sufficiently large concentration. When a material containing silver sulfide particles and/or copper sulfide particles is used as the silver ion and/or copper ion-supplying material, the requirements described above are all satisfied and hence the use of such a material is most preferred. The thickness of the colored layer and the light transmittance of the mask image obtained using such an ion-supplying material depend upon the kind of glass used, the heating temperature, the heating period of time, etc., but it is possible to form a colored layer having a thickness less than about 5 $\mu$m, preferably less than about 3 $\mu$m, and having a transmittance at a wavelength of 400 nm less than about 1%, preferably less than about 0.3%.

The reason why a mask image having a thin colored layer and a high optical density is obtained by using silver sulfide and/or copper sulfide is not at present completely clear. However, since in using such an ion supplying material, it is possible to form a mask image having a transmittance below about 1.0%, preferably below about 0.3%, at a wavelength of 400 nm even if the thickness of the mask image is less than about 5 $\mu$m, preferably less than about 3 $\mu$m, the resolving power can be increased to an extent capable of sufficiently resolving a line of a thickness of about 5 $\mu$m, preferably about 3 $\mu$m, suitable for, for example, IC circuits.

In using a mixture of silver sulfide and copper sulfide, a more preferred result is obtained and in this case, it is assumed that not only silver ions but also copper ions diffuse into the surface of the glass support. The particle size of these silver sulfide and copper sulfide is less than about 50 $\mu$m, preferably less than 20 $\mu$m, more preferably less than 10 $\mu$m and a suitable amount of copper sulfide per part by weight of silver sulfide is 2 parts by weight or less of copper sulfide per part by weight of silver sulfide.

An electric field can also be applied to the ion-supplying material in addition to the heat treatment for coloring the surface of glass support. That is, the application of an electric field is effective in promoting the ion exchange between the ions generated from the ion-supplying material and the sodium or potassium ions from the glass. In this case, an electric field of about 1 to about 100 volts/mm (in the depth direction), preferably 2 to 50 volts/mm, more preferably 4 to 25 volts/mm can be applied.

Then, by removing the relief and remaining ion-supplying material from the photographic plate with the imagewise colored mask image on the glass support surface, a final mask image is formed as shown in FIG. 6. The removal of the relief and the ion-supplying material can be performed using any material or method capable of removing the remaining ion-supplying material, for example, an aqueous solution of sodium hydroxide, sodium hypochloride, etc., or a mixture of sulfuric acid and chromic acid.

A particularly preferred embodiment for forming the relief image in this invention is described below. After imagewise exposing a glass support having a silver halide emulsion layer thereon and then developing (without fixing) such, the silver image formed is subjected to a tanning bleach with a bleach solution containing hexavalent chromium ions and halogen ions, e.g., provided by sodium chloride, potassium chloride, sodium bromide, hydrogen chloride, etc. A bleach solution containing sodium chromate, potassium chromate, ammonium chromate, etc. can also be used. If desired an acid (e.g., sulfuric acid and acetic acid, etc.) can be added to the bleach solution. Then, the silver halide emulsion layer is uniformly exposed to light and developed again, and silver is formed in all areas. Then, the photosensitive plate is subjected to an etch bleach, the silver halide emulsion is removed only at the non-image exposed portions without being removed at the image-exposed portions. Thereafter, the formation of the ion-supplying material layer, heat treatment, etc., are preformed as described above.

In the preferred embodiment described above, the negative-to-positive relationship is opposite to that in the case described earlier. This embodiment is excellent since the resolving power is very high. When a relief of a silver halide emulsion layer is formed using an ordinary etch-bleaching, the resolving power is about 10 to 20 $\mu$m but by using the embodiment described immediately above, the resolving power is about 3 to 4 $\mu$m. Furthermore, for obtaining this effect, the bleach solution must contain halogen ions in addition to hexavalent chromium ions (e.g., potassium dichromate and hydrochloric acid) and a bleach solution comprising an aqueous solution of potassium dichromate and sulfuric acid used ordinarily for reversal development or tanning bleaching is unsuitable to obtain this effect.

According to a second embodiment of this invention, a silver halide emulsion layer, either unhardened or slightly hardened, is imagewise exposed, developed as in the first embodiment mentioned above (if desired, fixed), and then the silver image thus formed is subjected to tanning-bleaching using a tanning-bleaching solution to harden the silver halide emulsion layer at the silver image-bearing portions. Thereafter, the silver halide emulsion layer at the non-image-bearing portions is washed away with warm water (e.g., at about 40° C. to about 60° C.) to uncover thereunder the surface of the glass support. Then, the steps involving the formation of an ion-supplying material layer, heat treatment, etc., as in the first embodiment, are performed.

In tanning-bleaching the binder at the silver image-bearing portion of a silver halide emulsion layer is hardened when it is bleached. Suitable tanning-bleaching solutions are an aqueous solution containing hexavalent chromium ions and an acid, for example, an aqueous solution containing at least one of ammonium dichromate, potassium dichromate, sodium dichromate, etc., and at least one of hydrochloric acid, sulfuric acid, acetic acid, etc. Since the hardened image portions are not dissolved in warm water only, the non-image-bearing portions are dissolved away by the warm water to uncover the surface of glass support at these portions only. Tanning-bleaching and suitable compositions for the tanning-bleaching solution are described in P. Glafkides; *Photographic Chemistry*; Vol. 2, pages 666–667 Fountain Press, London, (1958).

According to a third embodiment of this invention, a silver halide emulsion layer, either unhardened or sightly hardened, is imagewise exposed, subjected to a tanning development to harden the silver halide emulsion layer at the image-bearing portions, and then the emulsion layer at the non-image-bearing portions is washed away with warm water to uncover the surface of the glass support at these portions. Thereafter, the subsequent steps such as the formation of an ion supplying material layer, heat treatment, etc., are performed as in the first embodiment of this invention as previously described. In the tanning development employed in this embodiment, the binder of the silver halide emulsion layer at the silver image-bearing portions is hardened by the development. Tanning development is described in, for example, P. Glafkidis; *Photographic Chemistry, supra* Vol. 2, pages 664–666. Known tanning developers may be used for this development in this embodiment.

These relief images may further be formed by utilizing the thermal decomposition of the binder forming the silver halide emulsion layers. Such embodiments are illustrated below in a fourth embodiment to a sixth embodiment of this invention.

In a fourth embodiment of this invention, after imagewise exposing and developing a silver halide emulsion layer on a glass support and then subjecting the silver image formed to a tanning-bleaching with a tanning-bleaching solution as in the second embodiment described above, the emulsion layer is heated at about 350° C. to about 500° C. in the presence of oxygen to decompose and volatilize away preferentially the binder of the emulsion layer at the bleached portions, whereby the surface of the glass support is uncovered at these portions.

In a fifth embodiment of this invention, a silver halide emulsion layer on a glass support is imagewise exposed followed by development and fixing to form a silver image, the emulsion layer is baked at about 400° C. to about 550° C. in the presence of oxygen until the binder in the emulsion layer at the silver image-bearing portions is preferentially decomposed and volatilized away, and then the silver image is dissolved away to uncover the surface of glass support at these portions.

According to a sixth embodiment of this invention, after forming a silver image by imagewise exposing a silver halide emulsion layer on a glass support followed by development and fixing, the emulsion layer is heated at about 250° C. to about 500° C. to thermally decompose the binder of the emulsion layer selectively at the non-image portions and to remove the thus-decomposed binder using a binder removing solution, for example, an aqueous solution containing about 0.1 to about 20% by weight of a material generally known as a bleaching agent, such as sodium hypochlorite, potassium hypochlorite, sodium hypochlorite, potassium hypobromite, sodium hypobromite, sodium chlorite, potassium chlorite, sodium chlorate, potassium chlorate, sodium bromate, potassium bromate, etc., whereby the surface of the glass support is uncovered at these portions, while the binder at the silver image portions remains together with the silver image. Suitable temperatures for binder removal range from about 15° to about 60° C. The binder removal time depends on the concentration, temperature and type of binder removing solution and cannot be set forth unequivocally. However, in general, a binder removal time ranging from about 10 sec to about 30 min is employed.

Furthermore, the formation of such relief images can be also performed using a dry system. For example, relief images can be formed by utilizing ion etching or plasma etching as described in U.S. Pat. No. 4,056,395 and Japanese Patent Application (OPI) No. 85,723/'76. That is, after imagewise exposing and developing (and then, if desired, fixing) a photosensitive plate comprising a glass support having formed thereon a silver halide emulsion layer, an ion etching treatment or plasma etching treatment as described above is applied to the plate, whereby the emulsion layer at the non-image-bearing portions is selectively removed, while the emulsion layer at the silver image-bearing portions remains as a relief image. Then, an ion-supplying material layer is formed on the glass support having the relief image thus formed thereon followed by heat-treating, whereby the objects of this invention can be also achieved.

Various embodiments of forming relief images in this invention are described above in detail but relief images composed of silver halide emulsion layer of any type may be utilized in this invention. For example, the relief images utilized in this invention may be prepared by applying known intensification and toning treatments e.g., as described in U.S. Pat. No. 4,056,395 to the silver halide emulsion layer.

Furthermore, as a matter of course, mask images in the opposite nega-posi relationship to the mask images described above can be obtained by using reversal silver halide emulsions or known reversal development procedures.

The following examples are given to illustrate the present invention in greater detail but the present invention is not to be construed as being limited thereto. Unless otherwise indicated, all parts, percents, ratios and the like are by weight.

EXAMPLE 1

Using 50 g of gelatin and 188 g of silver bromide, 1400 ml of a silver bromide emulsion (having a mean grain size of about 0.06 $\mu$m) was prepared. The silver halide emulsion was optically sensitized to the wavelength range of 510 to 530 nm by the addition of 4-methyl-2,3-diethoxathiazolo-carbocyanine iodide and then applied at a dry thickness of about 5 $\mu$m to a soda lime glass support having thereon a gelatin subbing layer of a thickness of about 0.1 $\mu$m to provide a photosensitive plate. The photosensitive plate was imagewise exposed and developed in a developer having the following composition for 5 minutes at 24° C.

| Developer Composition: | |
|---|---|
| 1-Phenyl-3-pyrazolidone | 0.5 g |
| Sodium Sulfite | 50 g |
| Hydroquinone | 12 g |
| Sodium Carbonate (monohydrate) | 60 g |
| Potassium Bromide | 2 g |
| Benzotriazole | 0.2 g |
| 1-Phenyl-5-mercaptotetrazole | 5 mg |
| Phenazine-2-carboxylic Acid | 1 g |
| Water to make | 1 liter |

Then, after immersing the thus-obtained plate in a 1.5% aqueous solution of acetic acid for 30 seconds to stop the development, the plate was washed with water for one minute and the silver image-bearing portions thus formed were etch-bleached in an etch-bleaching solution having the following composition for 2 minutes at 20° C., whereby the surface of the glass support was uncovered at the silver image portions.

| Etch Bleach Solution: | |
|---|---|
| Solution A: | |
| Cupric Chloride | 10 g |
| Citric Acid | 10 g |
| Water to make | 1 liter |
| Solution B: | |
| 3% aqueous solution of hydrogen peroxide. | |

The etch bleach solution was prepared by mixing 1 part by volume of Solution A and 1 part by volume of Solution B immediately before use.

Then, after washing the plate for 5 minutes with water followed by drying the plate, an ion-supplying composition prepared as follows was applied over the entire surface of the plate using screen printing at a dry thickness of about 20 $\mu$m.

Preparation of Ion-Supplying Composition

A mixture of the following components was kneaded for about 12 hours in a ball mill.

| | |
|---|---|
| Silver Sulfide (Ag$_2$S, grain size 0.1–5$\mu$m) | 400 g |
| Copper Sulfide (CuS, grain size 0.1–5$\mu$m) | 300 g |
| Turpentine Oil | 280 g |
| Oleic Acid | 20 g |

After drying the coating for 15 minutes at 110° C., the plate was heated for 45 minutes at about 430° C. and then washed with a chromic acid to remove the dried residue and the silver halide emulsion layer.

The durable photomask thus obtained reproduced a pattern of a width of about 12 $\mu$m and the pattern formed was sharp and had high contrast.

EXAMPLE 2

After forming a silver image in a silver halide emulsion layer as described in Example 1 using a photosensitive plate prepared in the same manner as described in Example 1, the plate was fixed using a fixing solution having the following composition.

| Fixing Solution: | |
|---|---|
| Ammonium Thiosulfate (70% aq. soln.) | 200 ml |
| Sodium Sulfite | 15 g |
| Boric Acid | 8 g |
| Glacial Acetic Acid | 16 ml |
| Aluminum Sulfate | 10 g |
| Sulfuric Acid (98 wt. %) | 2 ml |
| Water to make | 1 liter |

After washing and drying, the thus-obtained plate was heated to 400° C. for 10 minutes in the air. Then, after allowing the plate to cool to room temperature, the plate was immersed in a 2% by weight aqueous solution of sodium hypochlorite (20° C.) for 2 minutes, whereby the thermally decomposed binder at the non-image portions was almost completely removed to uncover the surface of the glass support, while the binder at the silver image portions was scarcely removed. Thereafter, by coating an ion-supplying material composition having the same composition as described in Example 1 in the same manner as described in Example 1 followed by the subsequent treatments as described in Example 1, a durable photomask was obtained.

The photomask thus obtained well reproduced lines of a thickness of 4-5 μm.

Comparison Example 1

A positive-type phototresist, AZ-1350 was coated on a glass support as described in Example 1 at a dry thickness of about 3 μm. The photosensitive plate was prebaked for 5 minutes at 90° C. and then exposed to ultraviolet light through a master mask. The plate was, then, developed with a 0.5% aqueous solution of sodium hydroxide, washed with water, dried, and post-baked for 2 minutes at 110° C. Thereafter, an ion-supplying material composition as described in Example 1 was coated as described in Example 1 and the plate was further treated in the same manner as described in Example 1. In this case, the difference in optical density at 400 nm between the photoresist carrying portions and portions where no photoresist was present was less than 0.3.

On comparing the results of the examples of this invention with the results of this comparison example, it can be seen that the use of a silver halide emulsion layer shows high masking effect to the thermal diffusion of silver as compared with the case of using a photoresist.

While the invention has been described in detail and with reference to specific embodiments thereof, it will be apparent to one skilled in the art that various changes and modifications can be made therein without departing from the spirit and scope thereof.

What is claimed is:

1. A method for producing a durable photomask which comprises
   (1) imagewise exposing a photosensitive material comprising a glass support having, directly or on a subbing layer, a silver halide emulsion layer thereon followed by development of the silver halide emulsion layer,
   (2) removing the emulsion layer at either the image-exposed portions or the non-image-exposed portions to uncover the surface of the glass support at the portions where the emulsion layer was removed while leaving the emulsion layer in the other portions on the glass support,
   (3) applying a silver ion-supplying material and/or copper ion-supplying material onto at least the uncovered portions of the glass support, wherein silver ions and/or copper ions are capable of being diffused into the glass support from the silver ion-supplying material and/or copper ion-supplying material on heating to color the diffused portions of the glass support,
   (4) heating the glass support having the silver ion and/or copper ion-supplying material thereon to a temperature of at least about 375° C. to selectively diffuse the silver ions and/or copper ions only into the uncovered portions of the glass support, and
   (5) then removing the emulsion layer and the silver ions and/or copper ion-supplying material remaining on the glass support.

2. The method for producing a durable photomask as claimed in claim 1, wherein the method comprises imagewise forming a silver image in the image-exposed portions of the emulsion layer by imagewise exposing and developing the photosensitive material in step (1) and then removing the emulsion layer at the silver image-bearing portions by etch-bleaching with an etch-bleaching solution in step (2).

3. The method for producing a durable photomask as claimed in claim 1, wherein the silver ion-supplying material is silver sulfide.

4. The method for producing a durable photomask as claimed in claim 1, wherein the silver ion-supplying material is silver nitrate, silver chromate, silver chloride, silver sulfate or $AgI_4WO_4$.

5. The method for producing a durable photomask as claimed in claim 1, wherein the copper ion-supplying material is copper sulfide.

6. The method for producing a durable photomask as claimed in claim 1, wherein the copper ion-supplying material is copper nitrate, copper chloride or copper sulfate.

7. The method for producing a durable photomask as claimed in claim 1, wherein the method comprises forming a silver image in the image exposed portions of the emulsion layer by imagewise-exposing and developing the photosensitive material and then, tanning bleaching the silver image with a bleach solution containing hexavalent chromium ions and a halogen ions, uniformly exposing the emulsion layer to light and again developing the emulsion layer in step (1), and the removing of the emulsion layer in step (2) is at the non-image exposed portions by etch-bleaching.

8. The method for producing a durable photomask as claimed in claim 1, wherein the silver halide emulsion layer on the glass support is an unhardened or slightly hardened silver halide emulsion layer, and the method comprises forming a silver image in the image exposed portions of the emulsion layer by imagewise exposing and developing the photosensitive material and then, tanning-bleaching the silver image portions with a tanning bleaching solution to harden the emulsion layer at the silver image portions in step (1), and the removing of the emulsion layer in step (2) is at the non-image portions by washing away the non-image portions with warm water.

9. The method for producing a durable photomask as claimed in claim 1, wherein the method comprises forming a silver image in the image exposed portions of the emulsion layer by imagewise exposing and tanning developing the emulsion layer to harden the emulsion layer at the image exposed portions in step (1), and then the removing of the emulsion layer in step (2) is at the non-image portions by washing away the non-image portions with warm water.

10. The method for producing a durable photomask as claimed in claim 1, wherein the silver halide emulsion layer on the glass support is an unhardened or slightly hardened silver halide emulsion layer, and the method comprises forming a silver image in the image exposed portions of the emulsion layer by imagewise exposing and developing the photosensitive material and then, tanning bleaching the silver image in the image-exposed portions with a tanning bleaching solution, and then the removing of the emulsion layer in step (2) is by heating the emulsion layer in the presence of oxygen to decompose preferentially the binder of the emulsion layer at the bleached portions and volalilize off the decomposed binder, whereby the surface of the glass support is uncovered at the portions where the emulsion layer is removed.

11. The method for producing a durable photomask as claimed in claim 1, wherein the method comprises imagewise exposing, developing, and fixing the silver halide emulsion layer to form a silver image in step (1) and the removing of the emulsion layer in step (2) is by baking the material in the presence of oxygen until the binder of the emulsion layer at the silver image-bearing portions is preferentially decomposed and volatilized away, and then dissolving off the silver image remaining to uncover the surface of the glass support at the dissolved-off portions.

12. The method for producing a durable photomask as claimed in claim 1, wherein the method comprises imagewise exposing, developing and fixing the silver halide emulsion layer to form a silver image in step (1) and the removing of the emulsion layer in step (2) is by heating the emulsion layer to a high temperature to thermally decompose the binder of the emulsion layer, and selectively removing the thermally decomposed binder at the non-image portions with a binder removing solution to uncover the surface of the glass support at the portions while the binder at the silver image portions remains together with the silver image.

* * * * *